(12) United States Patent
Wang et al.

(10) Patent No.: US 9,023,224 B2
(45) Date of Patent: May 5, 2015

(54) METHOD OF FORMING A SPACER PATTERNING MASK

(71) Applicant: Semiconductor Manufacturing International (Shanghai) Corporation, Shanghai (CN)

(72) Inventors: Xinpeng Wang, Shanghai (CN); Haiyang Zhang, Shanghai (CN)

(73) Assignee: Semiconductor Manufacturing International (Shanghai) Corporation (CN)

(*) Notice: Subject to any disclaimer, the term of this patent is extended or adjusted under 35 U.S.C. 154(b) by 0 days.

(21) Appl. No.: 14/278,538

(22) Filed: May 15, 2014

(65) Prior Publication Data

US 2014/0342559 A1    Nov. 20, 2014

(30) Foreign Application Priority Data

May 17, 2013   (CN) .......................... 2013 1 0183224

(51) Int. Cl.
| | |
|---|---|
| B44C 1/22 | (2006.01) |
| C03C 15/00 | (2006.01) |
| C03C 25/48 | (2006.01) |
| C23F 1/00 | (2006.01) |
| H01L 21/302 | (2006.01) |
| H01L 21/461 | (2006.01) |
| H01L 21/306 | (2006.01) |
| H01L 21/308 | (2006.01) |

(52) U.S. Cl.
CPC ...... *H01L 21/30625* (2013.01); *H01L 21/3083* (2013.01)

(58) Field of Classification Search
CPC .. H01L 21/31; H01L 21/3086; H01L 21/3088
USPC ................................ 438/692; 216/38, 46, 52
See application file for complete search history.

(56) References Cited

U.S. PATENT DOCUMENTS

| | | | |
|---|---|---|---|
| 6,042,998 A | 3/2000 | Brueck et al. | |
| 2009/0246954 A1* | 10/2009 | Miyoshi et al. | ............... 438/689 |
| 2014/0017889 A1* | 1/2014 | Lee et al. | ....................... 438/674 |
| 2014/0167119 A1* | 6/2014 | Javorka et al. | ................. 257/288 |

* cited by examiner

*Primary Examiner* — Binh X Tran
*Assistant Examiner* — Thomas Pham
(74) *Attorney, Agent, or Firm* — Innovation Counsel LLP

(57) ABSTRACT

The present disclosure pertains to a method of forming a spacer patterning mask. The method entails: providing a substrate; depositing, on the substrate, an interface layer, a core film and a first hard mask; patterning the core film and the first hard mask to form strips; depositing a spacer patterning layer to cover the core film and the first hard mask in the intermediate pattern; planarizing the spacer patterning layer by using the first hard mask in the intermediate pattern as a stop layer; etching the planarized spacer patterning layer; dry etching the second hard mask to expose the partially-etched spacer patterning layer; dry etching the exposed spacer patterning layer to form a spacer pattern; and removing the remaining first hard mask and second hard mask and the core film to obtain the final spacer patterning mask.

14 Claims, 6 Drawing Sheets

METHOD OF FORMING A SPACER PATTERNING MASK

CROSS-REFERENCE TO RELATED APPLICATIONS

This application claims priority to Chinese Patent Application No. 201310183224.5 filed on May 17, 2013 and entitled "Method of Forming Spacer Patterning Mask", which is incorporated herein by reference in its entirety.

BACKGROUND OF THE DISCLOSURE

1. Field of the Disclosure

The present disclosure relates to a method of fabricating a semiconductor device, and more specifically to a method of forming a spacer patterning mask.

2. Description of the Related Art

Development of semiconductor process technology towards an increasingly smaller node poses various new challenges. One of the challenges in making the nodes smaller is presented by lithography. In lithography, many believe that double patterning technology will probably be the final solution for mass production and continued scale-down of the IC structure.

Currently, there are primarily three typical double patterning technologies: Litho-Etch-Litho-Etch (LELE) shown in FIG. 1A, Litho-Freeze-Litho-Etch (LFLE) shown in FIG. 1B, and spacer self-aligned double patterning (SADP) shown in FIG. 1C.

As shown in FIG. 1A, LELE entails a first litho step followed by a first etch step, a second litho step, and a second etch step. The precision level of the two litho steps is important for producing correct superimposition of layers. In other words, the alignment of a pattern exposed by the first litho step and a pattern exposed by the second litho step should be precise and accurate. Achieving the precise alignment with two lithography steps is challenging.

LFLE freezes a light-stop pattern and eliminates an etch step, but two high-precision lithography steps are still required to align the positions of the patterns.

SADP uses one critical etch step and thus avoids the double-litho challenge that is mentioned above. Moreover, the mask pattern formed by SADP comprises multiple etch steps and thus reduces critical dimension (CD) uniformity requirements in a single etch.

However, in the currently adopted SADP process, spacer deposition and etch process will cause a worse line width roughness (LWR) phenomena, for example, nonuniform line width and interval such as what is shown in FIG. 2, which will make a disadvantageous impact on the device performance.

SUMMARY OF THE DISCLOSURE

An object of the present disclosure is to provide an optimized method of forming a spacer patterning mask to solve the problems existing in the prior art and eliminate the LWR phenomenon, thereby improving device performance.

According to a first aspect of the present disclosure, there is provided a method of forming a spacer patterning mask that includes: providing a substrate, depositing, on the substrate, an interface layer, a core film and a first hard mask; patterning the core film and the first hard mask to form strips that include the core film and the first hard mask, wherein a first separation distance between neighboring strips is based on a second separation distance between patterns of the spacer patterning mask; depositing a spacer patterning layer over the core film and the first hard mask; planarizing the spacer patterning layer by using the first hard mask as a stop layer; etching the planarized spacer patterning layer, wherein an amount of etching is determined based on the desired separation distance between the patterns in the final spacer patterning mask; depositing a second hard mask; dry etching the second hard mask to expose the partially-etched spacer patterning mask, wherein a third separation distance between sections of the remaining second hard mask is based on the separation distance between patterns of the spacer patterning mask; dry etching the exposed spacer patterning layer to form a spacer pattern; removing the remaining first hard mask and second hard mask; and removing the core film to obtain the spacer patterning mask.

The interface layer may comprise silicon oxide. The method may further entail depositing the interface layer, by using chemical vapour deposition (CVD) or furnace process, to a thickness of 10-500 Å.

The core film may comprise a silicon film or amorphous carbon. The method may further include depositing the core film by CVD.

The method may further entail depositing the first hard mask by a furnace process and depositing the second hard mask by ALD or CVD to form a layer of the same thickness as the first hard mask, wherein the first and second hard masks comprise silicon nitride.

The first separation between strips of the core film and first hard mask may be twice as large as the second separation distance between patterns of the spacer patterning mask.

The method may further include depositing the spacer patterning layer comprising silicon oxide by ALD or CVD, wherein a thickness of the spacer patterning layer is greater than a sum of thicknesses of the core film and the first hard mask.

The planarizing may include using CMP.

The method may also include etching the spacer patterning layer by a wet removal process, such that the partially-etched spacer patterning layer is lower than or flush with the bottom of the first hard mask.

The method may also include dry etching the second hard mask such that the third separation distance between sections of the remaining second hard mask is equal to the second separation distance between patterns of the spacer patterning mask.

The method may entail using a wet etch to remove the first hard mask and the second hard mask.

The method may entail using a dry removal process to remove the core film comprising the amorphous carbon, wherein the dry removal process comprises a fluorine-free asking process using an atmosphere of $N_2/H_2/SO_2/CO/CO_2/O_2$, and using a wet chemical removal process to remove the core film comprising silicon.

During the etching of the planarized spacer patterning layer, the core film and the first hard mask may remain substantially intact.

During the dry etch of the second hard mask, the partially-etched spacer patterning layer and the first hard mask may remain substantially intact.

The depositing of the second hard mask comprises depositing the second hard mask over the partially-etched spacer patterning layer, and the first hard mask.

In the method, depositing of the interface layer, the core film, and the first hard mask may be done sequentially.

Further features of the present disclosure and advantages thereof will become apparent from the following detailed description of exemplary embodiments according to the present disclosure with reference to the accompanying drawings.

BRIEF DESCRIPTION OF THE DRAWINGS

The accompanying drawings, which are incorporated in and constitute a part of the specification, illustrate embodiments of the disclosure and, together with the description, serve to explain the principles of the disclosure.

With reference to the accompanying drawings, based on the following detailed description, the present disclosure will be more clearly understood, wherein.

DESCRIPTION OF THE EMBODIMENTS

Figure 1:
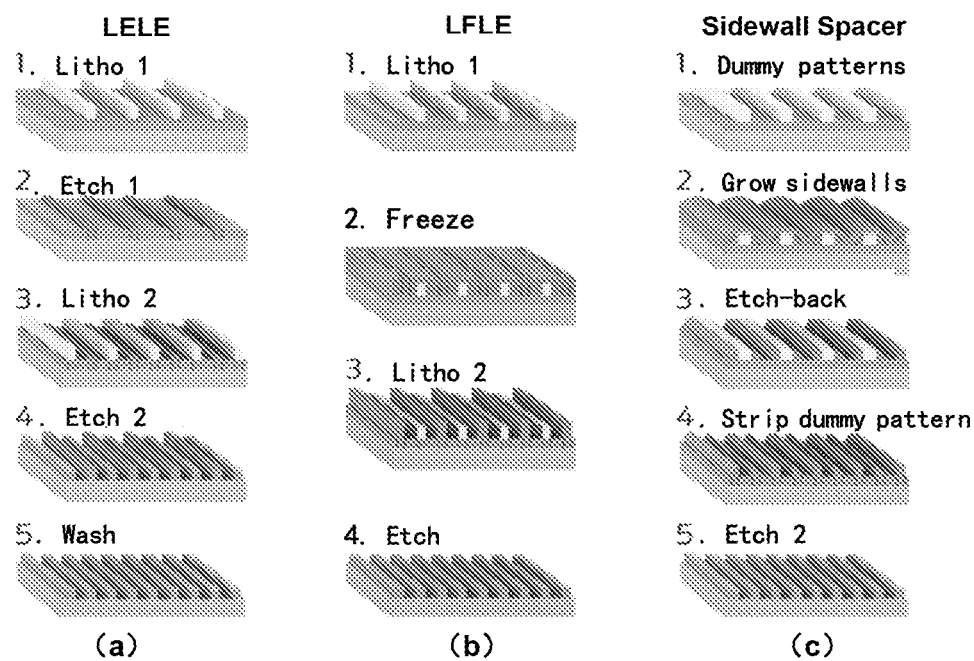
FIGS. 1A, 1B, and 1C are diagrams schematically showing three typical double patterning technologies in the prior art.
Figure 2:
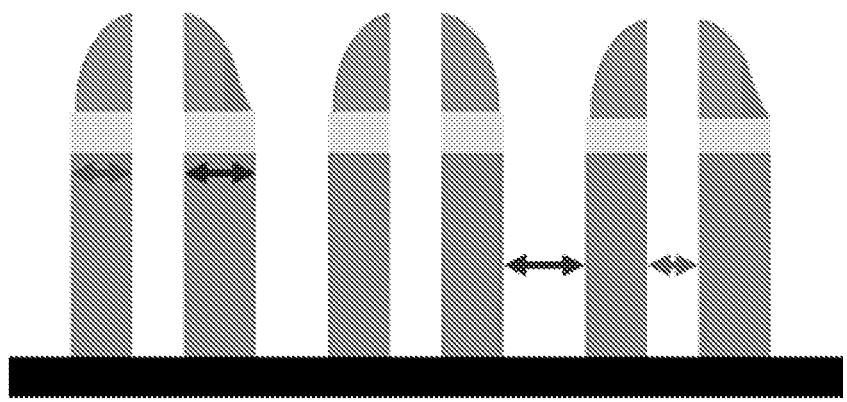
FIG. 2 is a diagram schematically showing a spacer patterning mask formed by the SADP process in the prior art.

Various exemplary embodiments of the present disclosure will now be described in detail with reference to the drawings. It should be noted that the relative arrangement of the components and steps, the numerical expressions, and numerical values set forth in these embodiments do not limit the scope of the present disclosure unless it is specifically stated otherwise.

Meanwhile, it should be understood that, for the convenience of description, various components in the drawings are not necessarily drawn to scale.

The following description of at least one exemplary embodiment is merely illustrative in nature and is in no way intended to limit the disclosure, its application, or uses.

Techniques, methods and apparatus as known by one of ordinary skill in the relevant art may not be discussed in detail but are intended to be part of the specification where appropriate.

In all of the examples illustrated and discussed herein, any specific values should be interpreted to be illustrative only and non-limiting. Thus, other examples and embodiments could have different values.

It should be noted that similar reference numerals and letters refer to similar items in the figures. Thus, once an item is defined and described for one figure, any redundant description may be omitted for the following figures.

Figure 3:
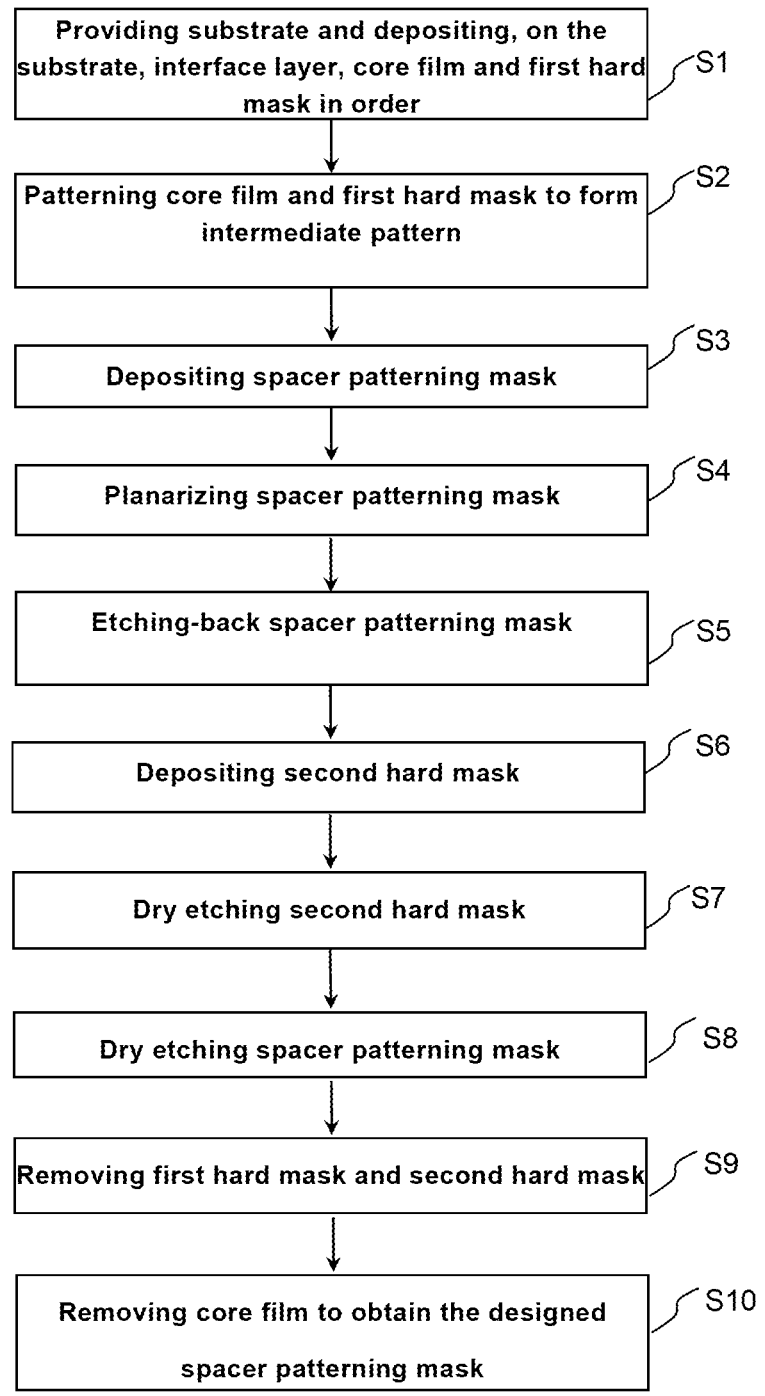
FIG. 3 is a flowchart schematically showing a method of forming a spacer patterning mask according to one embodiment of the present disclosure.

FIG. 3 is a flowchart showing a method of forming a spacer patterning mask according to one embodiment of the present disclosure.

FIGS. 4A~4J are cross-sectional views schematically showing the pattern obtained at various stages according to the method of FIG. 3.

The inventive concept will be described with reference to the flowchart shown in FIG. 3 and the cross-sectional views shown in FIGS. 4A~4J.

Figure 4A:
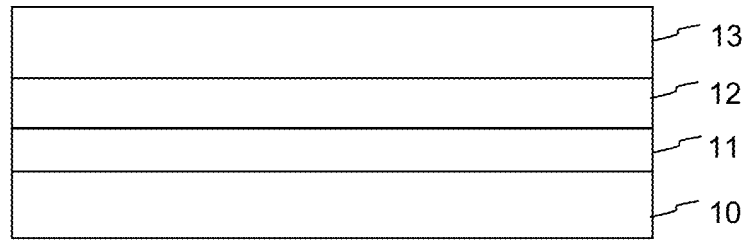
FIGS. 4A~4J are cross-sectional views schematically showing the pattern obtained at various stages according to the method of FIG. 3.

First, at step S1, a substrate 10 is provided and an interface layer 11, a core film 12 and a first hard mask 13 are deposited, e.g. sequentially, on the substrate 10 as shown in FIG. 4A.

The substrate 10 may be a semiconductor substrate such as silicon.

The interface layer 11 may include silicon oxide, and the thickness thereof may be about 10~500 Å. The interface layer can be deposited by chemical vapour deposition (CVD) or furnace process.

The core film 12 may comprise a silicon film or amorphous carbon, and the thickness thereof may be about 300~1000 Å. The core film comprising the amorphous carbon can be deposited by CVD.

The first hard mask 13 may comprise silicon oxide and the thickness thereof may be 300~1000 Å. The first hard mask can be deposited by furnace process.

Figure 4B:
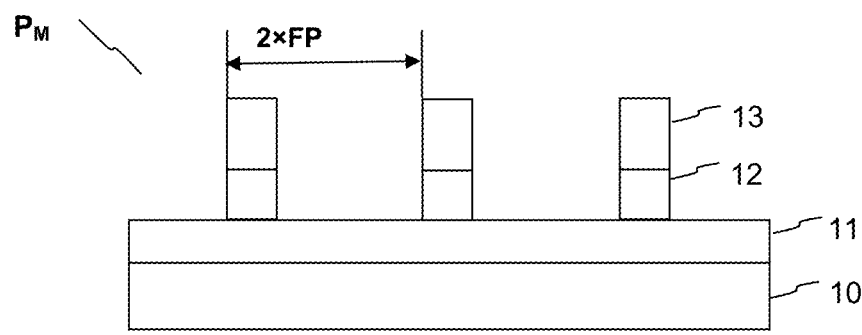
Figure 4C:
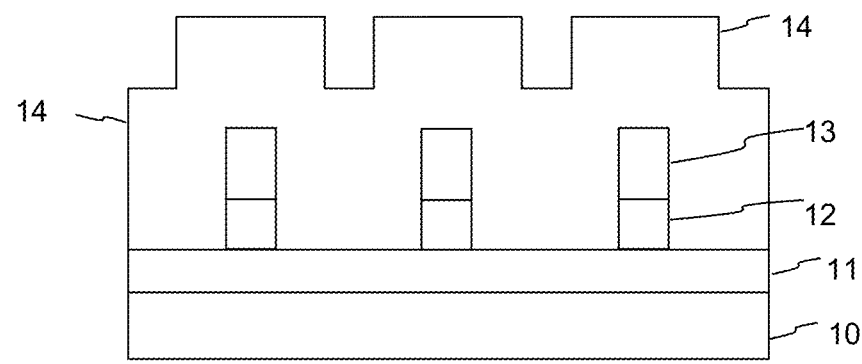

Next, at step S2, lithography is performed on the core film 12 and the first hard mask 13, to form an intermediate pattern $P_M$. The intermediate pattern $P_M$ includes strips that are spaced apart by a first separation distance. Each strip may include a layer of the core film 12 and a layer of the first hard mask 13, and the strips may be separated by a regular interval. The strips in the intermediate pattern $P_M$ may be separated by a first separation distance that has a predefined relation with respect to the second separation distance between the patterns in the spacer patterning mask that will ultimately be made. For example, as shown in FIG. 4B, lithography conditions can be controlled such that the first separation distance between strips in the intermediate pattern $P_M$ is twice as large as the second separation distance (FP) between of the patterns in the final spacer patterning mask (FP is shown in FIG. 4J). In other words, the first separation distance between strips of the intermediate pattern=2×FP, or two times the second separation distance (FP) between the patterns of the spacer patterning mask in the final design. The patterns in the spacer patterning mask may repeat at a regular interval.

Next, at step S3, the spacer patterning mask 14 is deposited to cover the core film 12 and the first hard mask 13 in the intermediate pattern $P_M$. For example, as shown in FIG. 4C, a thickness of the spacer patterning mask 14 can be greater than a sum of thicknesses of the core film 12 and the hard mask 13, e.g., 600~2000 Å, in select areas.

The spacer patterning layer 14 can be deposited by atomic layer deposition (ALD) or chemical vapour deposition (CVD), and the spacer patterning layer may comprise silicon oxide. As will be described, the spacer patterning layer 14 is formed into the space patterning mask 14.

Figure 4D:
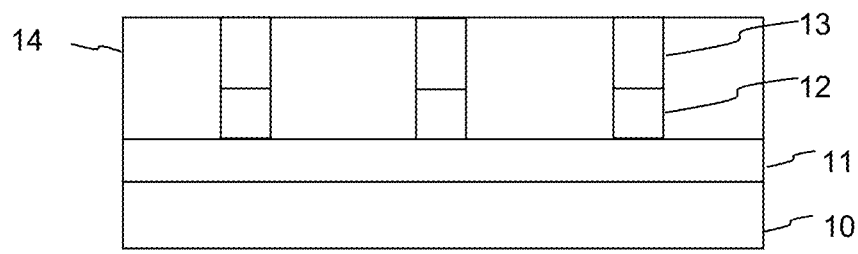

Next, at step S4, the spacer patterning layer 14 is planarized by using the first hard mask 13 in the intermediate pattern $P_M$ as a stop layer, for example, as shown in FIG. 4D, to obtain a planar spacer patterning mask 14.

The spacer patterning mask can be planarized by using a chemical-mechanical polishing (CMP) process, for example.

Figure 4E:
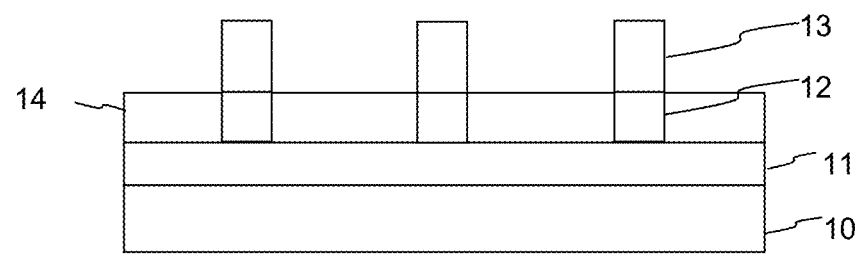

Next, at step S5, the planarized spacer patterning layer 14 is etched, e.g., partially etched. The amount of etching can be determined from the width of strips that will be formed in the final spacer patterning mask 14. For example, the top surface of the partially-etched spacer patterning layer 14 can be lower than the bottom of the first hard mask 13 in the intermediate pattern $P_M$ or be flush with the bottom of the first hard mask 13, for example, as shown in FIG. 4E. During the etching, the core film 12 and the first hard mask 13 in the intermediate pattern $P_M$ remain substantially intact (i.e., not etched).

The etching can be performed by using a wet etch process. Since a wet etch technique typically has a very high etch selection ratio, by selecting a suitable condition for the etch process, significant changes to the heights of the first hard mask and the core film may be avoided.

Figure 4F:
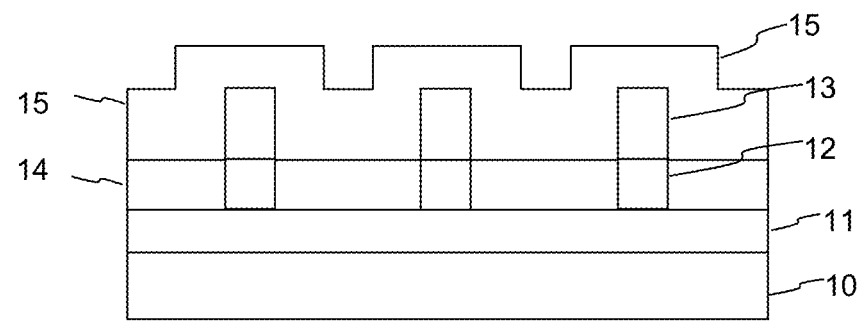

Next, at step S6, the second hard mask 15 is deposited. For example, as shown in FIG. 4F, the second hard mask 15 may be deposited over the partially-etched spacer patterning layer 14, and the strip containing the core film 12 and the first hard mask 13.

The second hard mask can be deposited by ALD or CVD. The second hard mask 15 and the first hard mask 13 can be made of the same material. The deposited first hard mask 13 and second hard mask 15 may have the same thickness.

Figure 4G:
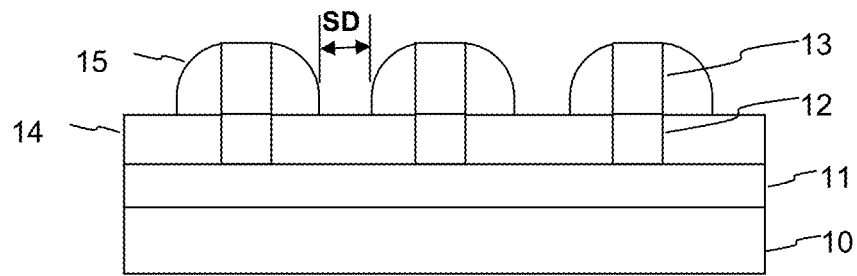

Next, at step S7, dry etch is performed on the second hard mask 15 to expose the etched spacer patterning mask 14. The third separation distance (SD) between sections of the remaining second hard mask 15 may have a predetermined relation to the second separation distance (FP) between patterns of the final spacer patterning mask 14. For example, the third separation distance (SD) between sections of the remaining second hard mask 15 can be equal to the second separation distance (SD) between the patterns of the final spacer patterning mask, for example, as shown in FIG. 4G and FIG. 4J.

During the dry etching of the second hard mask, an etch endpoint can be controlled by monitoring a signal returned from a surface being etched. For example, etching can end in response to an indication that the first hard mask 13 is going to be etched, such that the first hard mask 13 in the intermediate pattern $P_M$ and the partially-etched spacer patterning mask 14 will remain substantially intact (i.e., not etched). However, depending on the amount of time it takes to determine that the spacer patterning mask is being or about to be etched, the first hard mask 13 in the intermediate pattern $P_M$ may be partially etched.

Figure 4H:
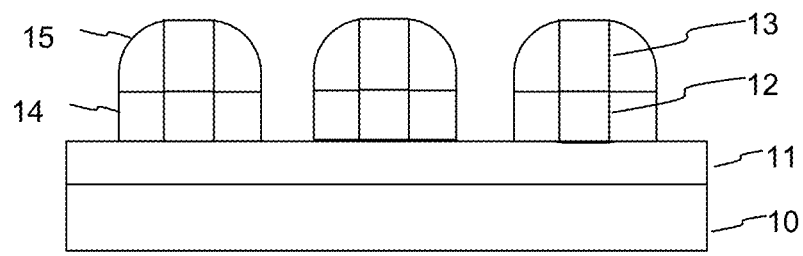

After performing dry etch on the second hard mask 15, at step S8, dry etch is further performed on the exposed spacer patterning layer 14 to form the spacer patterns as shown in FIG. 4H.

Those skilled in the art would know how to select a suitable dry etch process according to the material to be etched.

Figure 4I:
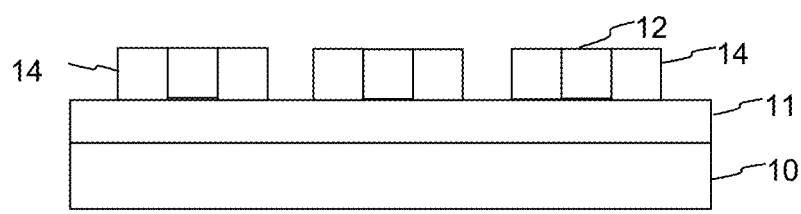
Figure 4J:
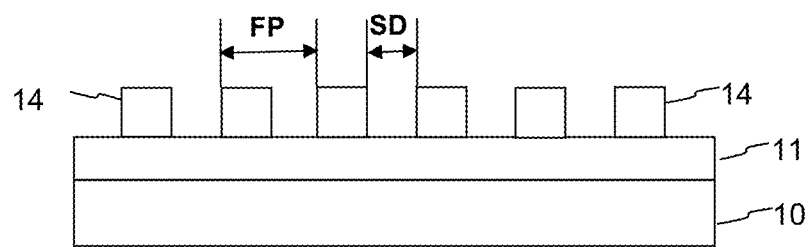

Next, at step S9, the first hard mask 13 and the second hard mask 15 are removed to obtain the structure shown in FIG. 4I.

In step S9, the remaining first hard mask and second hard mask can be removed using a wet etch, without damaging the spacer patterning mask 14. Moreover, those skilled in the art could select a suitable wet etch process according to the material to be etched.

Finally, at step S10, the core film 12 in the intermediate pattern $P_M$ is removed to obtain the designed spacer patterning mask 14, as shown in FIG. 4I.

For example, when the core film 12 comprises amorphous carbon, the core film can be removed by dry removal process. The dry removal process can comprise an asking process using an atmosphere of $N_2/H_2/SO_2/CO/CO_2/O_2$, which is Fluorine free.

Alternatively, when the core film 12 is a silicon film, the core film can be removed by using a wet chemical removal process. The wet removal process can use diluted HF.

Those skilled in the art could remove the core film by using a suitable method as needed, without damaging the interface layer underneath.

So far, the method of fabricating a semiconductor device according to the present disclosure as well as a semiconductor device formed thereby has been described in detail. In this specification, terms like "first" and "second" are not intended to imply any chronological order and may be interchangeable. In order to not obscure the concept of the present disclosure, some details already known in the art are not described. However, one of ordinary skill in the art absolutely knows how to implement the technical solution disclosed herein based on the above statements.

Although some specific embodiments of the present disclosure have been demonstrated in detail with examples, it should be understood by a person skilled in the art that the above examples are only intended to be illustrative but not to limit the scope of the present disclosure. It should be understood by a person skilled in the art that the above embodiments can be modified without departing from the scope and spirit of the present disclosure. The scope of the present disclosure is defined by the attached claims.

What is claimed is:

1. A method of forming a spacer patterning mask, comprising:
   providing a substrate;
   depositing, on the substrate, an interface layer, a core film and a first hard mask;
   patterning the core film and the first hard mask to form strips that include the core film and the first hard mask, wherein a first separation distance between neighboring strips is based on a second separation distance between patterns of the spacer patterning mask;
   depositing a spacer patterning layer over the core film and the first hard mask;
   planarizing the spacer patterning layer by using the first hard mask as a stop layer,
   wherein the planarizing comprises using chemical mechanical polishing (CMP);
   etching the spacer patterning layer, wherein an amount of etching is determined based on a separation distance and dimensions of patterns in the spacer patterning mask;
   depositing a second hard mask;
   dry etching the second hard mask to expose the spacer patterning layer, wherein a third separation distance between sections of the second hard mask has a predefined relation to the second separation distance between patterns of the spacer patterning mask;
   dry etching the spacer patterning layer to form a spacer pattern;
   removing the first hard mask and second hard mask; and
   removing the core film to obtain the spacer patterning mask.

2. The method according to claim 1, wherein the interface layer comprises silicon oxide, further comprising depositing the interface layer by using chemical vapour deposition (CVD) or furnace process to a thickness of 10-500 Å.

3. The method according to claim 1, wherein the core film comprises a silicon film or amorphous carbon, further comprising depositing the core film by using chemical vapour deposition (CVD).

4. The method according to claim 1, further comprising:
   depositing the first hard mask by using a furnace process, and
   depositing the second hard mask by ALD or CVD to form a layer of the same thickness as the first hard mask, wherein the first and second hard masks comprise silicon nitride.

5. The method according to claim 1, wherein the first separation distance between neighboring strips is twice as large as the second separation distance between patterns of the spacer patterning mask.

6. The method according to claim 1, further comprising depositing the spacer patterning layer comprising silicon oxide by using atomic layer deposition (ALD) or CVD, wherein a thickness of the spacer patterning layer is greater than a sum of thickness of the core film and thickness of the first hard mask.

7. The method according to claim 1, further comprising etching the spacer patterning layer by using a wet removal process, such that the spacer patterning layer is lower than or flush with the bottom of the first hard mask.

8. The method according to claim 1, further comprising dry etching the second hard mask such that the third separation distance between sections of the remaining second hard mask is equal to the second separation distance between patterns of the spacer patterning mask.

9. The method according to claim 1, further comprising using a wet etch to remove the first hard mask and the second hard mask.

10. The method according to claim 1, further comprising:
   using a dry removal process to remove the core film comprising amorphous carbon, wherein the dry removal process comprises a fluorine-free asking process using an atmosphere of $N_2/H_2/SO_2/CO/CO_2/O_2$; and
   using a wet chemical removal process to remove the core film comprising silicon.

11. The method according to claim 1, wherein during the etching, the core film and the first hard mask remain substantially intact during the etching of the spacer patterning layer.

12. The method according to claim 1, wherein the spacer patterning layer and the first hard mask remain substantially intact during the dry etch of the second hard mask.

13. The method according to claim 1, wherein the depositing of the second hard mask comprises depositing the second hard mask over the spacer patterning layer and the first hard mask.

14. The method according to claim 1, wherein the depositing of the interface layer, the core film, and the first hard mask on the substrate are done sequentially.

* * * * *